(12) United States Patent
Foley et al.

(10) Patent No.: US 6,477,044 B2
(45) Date of Patent: Nov. 5, 2002

(54) FLOW GUIDE

(75) Inventors: Nicholas Foley, Midlothian; Gerard MacManus, Slip End; Bruce Fryers, Leighton Buzzard; Michael Tate, Watford, all of (GB)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/776,031

(22) Filed: Feb. 2, 2001

(65) Prior Publication Data

US 2002/0081961 A1 Jun. 27, 2002

(30) Foreign Application Priority Data

Nov. 6, 2000 (GB) .............................................. 0027079

(51) Int. Cl.[7] ................................................. H05K 7/20
(52) U.S. Cl. ........................ 361/695; 361/802; 454/184
(58) Field of Search .......................... 454/184; 361/687, 361/695, 802

(56) References Cited

U.S. PATENT DOCUMENTS

| | | | | |
|---|---|---|---|---|
| 5,001,967 A | * | 3/1991 | Hungerford | |
| 5,210,680 A | * | 5/1993 | Scheibler | |
| 5,734,551 A | * | 3/1998 | Hileman et al. | 361/695 |
| 6,031,717 A | * | 2/2000 | Baddour et al. | 361/687 |
| 6,151,213 A | * | 11/2000 | Ater et al. | 361/695 |
| 6,222,729 B1 | * | 4/2001 | Yoshikawa | 361/695 |
| 6,230,541 B1 | * | 5/2001 | Mimlitch et al. | |

FOREIGN PATENT DOCUMENTS

| | | | |
|---|---|---|---|
| JP | 10-65372 | * | 3/1998 |
| JP | 11-109871 | * | 4/1999 |

* cited by examiner

*Primary Examiner*—Harold Joyce
(74) *Attorney, Agent, or Firm*—Michaelson & Wallace; Peter L. Michaelson; Janet M. Skafar

(57) ABSTRACT

A guide 2 for supporting a device in a flow of coolant includes a deflector 4 for modifying the coolant flow. The guide include apertures 6 so that the coolant can flow over both the upper and lower faces of a device, for example a printed circuit board 24.

13 Claims, 3 Drawing Sheets

FLOW GUIDE

The present invention relates to cooling devices, in particular, but not exclusively, to cooling electrical devices. Aspects of the present invention relate to a flow guide, to a support for a device, and to a support incorporating a flow guide. Aspects of the invention relate to electrical equipment, and to a method of cooling devices.

Embodiments of the invention relate more particularly to the cooling of electrical devices, for example devices which perform a processing or memory function, such as any processor (for example a semiconductor or other logic device, an integrated circuit, a microprocessor and the like) or any storage device (for example a mass storage device). In preferred embodiments of the invention, the device comprises a printed circuit board. Such devices may be in the form of an integrated circuit, possibly mounted on a printed circuit board. Accordingly, the electrical equipment may typically be a computer, modem, switch, hub or other equipment.

Electrical equipment such as a computer includes various electrical devices which generate heat during use. During use, such devices become warm. It is undesirable for the device to become too hot because excessive heat can cause damage to components of the device. It is known to cool electrical devices using one or more fans and indeed a cooling fan is often provided in electrical equipment. In a conventional arrangement, electrical devices are arranged within a casing. The fan sucks air through one or more grilles in the casing, the air passes over the devices and out of the casing via the fan.

However, under many conditions, such arrangements have been found to be inefficient.

One problem is losses in air flow which can be caused by changes in flow direction of the coolant flow, for example by hitting a barrier and creating static pressure. This can reduce the cooling properties of the coolant flow.

It is an object of the present invention to improve the cooling of the electrical device and/or to improve the efficiency of the cooling. One benefit of improving the efficiency of the cooling is that smaller and/or fewer fans could be used to obtain the desired cooling effect. Also, the need for additional heatsinks or heatpipes for cooling the devices may be reduced. This could lead to savings in cost and a reduction in the weight of the equipment.

According to a first aspect of the invention, there is provided a guide for supporting a device in a flow of a coolant, the support including a deflector for modifying the coolant flow.

Preferably the deflector is arranged for directing the coolant flow.

Where guides are used for supporting a device in a flow of coolant (for example air), there is often a reduction in the flow velocity caused by an abrupt change in the flow direction at the support. The flow of air effectively hits a barrier at the support, increasing static pressure. By providing the deflector, the losses in air flow caused by changes in the flow direction can be reduced. This enables the air to continue at a level close to its original speed, thus maximising its cooling properties.

The deflector can be arranged to direct the flow of coolant at the device to improve cooling of the device.

The guide can also be used downstream of the device. In this case, the deflector can be arranged so as to minimise speed losses due to flow separation as the flow leaves the edge of the device. The deflector may act as a diffuser downstream of the device to recover pressure and improve the efficiency of cooling.

Preferably the guide is adapted to support a printed circuit board. In preferred embodiments, the device comprises a module, card or printed circuit board (PCB).

Preferably the guide further includes a portion, preferably a formation, for engagement with the device. Where the device is a module, card or PCB, preferably the guide includes a slot, groove or channel into which the device may be inserted.

As discussed below, the equipment may comprise a pair of guides, and the device may be slotted between the guides. However, it is envisaged that the guide might be attachable directly to the device, for example using a clip or other formation, or in another way, for example using adhesive.

In a broad aspect of the invention, there is provided a flow guide for modifying the flow of a coolant past a device, the guide comprising a device engaging portion, for example a formation for attaching the guide to the device, and a deflector for modifying the coolant flow. Thus the guide may be separate from the support for the device.

Preferably the deflector includes a flow modifying surface adapted to be angled in use relative to the direction of coolant flow. Thus the surface can direct the flow, for example towards the device. In preferred embodiments, the guide includes a base for attaching the guide to the equipment; preferably the flow modifying surface is angled with respect to the base. Preferably the angle of the surface is between about 10° and 30°, preferably between 20° and 25°, preferably about 23°.

In embodiments of the invention, the angle of the surface to the coolant flow may vary along the width of the deflector. Thus the flow can be modified to the exact requirements of the device to be cooled so that the flow is directed to the desired areas of the surfaces of the device or devices to be cooled.

The modifying surface may be a planar surface or may be curved and may include formations for increasing turbulence or producing other desired flow patterns, thus giving improved cooling of the device.

In embodiments of the invention, the guide includes a plurality of flow modifying surfaces. Thus the coolant can be directed to more than one surface of the device or to more than one device and/or modify the flow of two or more coolant streams.

In preferred embodiments, the deflector includes two flow modifying surfaces. For example, the deflector may include an upper and a lower surface, so that two sides of a device can be cooled. This is particularly advantageous for the cooling of PCBs in that both sides can be cooled at the same time and the flow over the top and bottom surfaces can be modified using a single guide.

Preferably the guide includes an aperture. By including an aperture, the guide can be arranged in the coolant flow and yet allow the flow to reach more than one surface of the device.

This feature is of particular importance and is provided separately. Thus a further aspect of the invention provides a guide for supporting a device in a flow of a coolant, the guide including an aperture.

A preferred embodiment of the invention provides a guide for supporting a printed circuit board in a flow of coolant, the guide including an attachment portion for engaging the printed circuit board, the guide including a deflector for modifying the flow of coolant flowing past a first surface of the printed circuit board and further including an aperture for a flow of coolant flowing past a second surface of the printed circuit board.

Preferably the guide includes a plurality of apertures. Thus more of the coolant can flow past the device while retaining the structural strength of the guide. The apertures can be arranged so that the coolant flow is directed to particular areas of the device or devices, for example at hot areas.

Preferably the guide further includes a flow modifying surface associated with the aperture. Thus the cooling of the devices can be improved.

Preferably the guide comprises conductive material. Thus heat may be removed by conduction from the device, further enhancing cooling. In preferred embodiments of the invention, the guide comprises heat conducting polymer material.

Preferably the guide is mouldable, preferably injection mouldable. Preferably the guide is formable, preferably able to be moulded, in one piece, preferably by injection moulding. Preferably the guide is formable by injection moulding in one piece. While it is envisaged that the guide can be made in several pieces and subsequently joined, the cost of manufacture and assembly of the guide can be reduced if a one-piece guide is used.

The invention further provides an apparatus including a guide as described herein. Preferably the apparatus includes an inlet for the coolant, wherein the guide is arranged immediately adjacent the inlet. By arranging the guide directly downstream of the inlet, better flow can be obtained.

This feature is of particular importance and is provided separately. Thus according to a further aspect of the invention, there is provided an apparatus including an enclosure and means for generating a flow of coolant in the enclosure, the equipment further including a guide for modifying the flow of a coolant past a device in the enclosure, the enclosure comprising an inlet for the coolant, wherein the guide is arranged immediately downstream of the inlet.

Also provided is an apparatus including an enclosure and means for generating a flow of coolant in the enclosure, the equipment further including a guide for modifying the flow of a coolant past a device in the enclosure, the enclosure comprising an outlet for the coolant, wherein the guide is arranged immediately upstream of the outlet.

For example, where the apparatus includes a housing having a grille, the guide is preferably arranged so that it is immediately adjacent the grille. Where the guide has a deflector, preferably the deflector is arranged immediately adjacent the grille. Thus improved flow characteristics can be achieved.

Also, as described in more detail below, the guide can be used to split the flow into more than one flow stream. The arrangement of the guide can determine the proportion of the coolant flow entering each stream.

An aspect of the invention provides an apparatus including an enclosure and means for generating a flow of coolant in the enclosure, the equipment further including a guide for supporting a device in the flow of coolant, the guide including a deflector for modifying the coolant flow.

Preferably the guide is arranged to be upstream of a device, the deflector being adapted to direct the coolant flow past the device.

Preferably the apparatus further includes a guide arranged to be downstream of a device, for modifying the coolant flow.

An aspect of the invention further provides an apparatus including an enclosure and means for generating a flow of coolant in the enclosure, the equipment further including a guide for supporting a device in the flow of coolant, the guide including an aperture for the coolant flow.

Preferably the equipment further comprises a fan. Where reference is made herein to the use of a fan, that term is preferably to be interpreted broadly to include all devices suitable for effecting flow of the coolant.

Preferably the coolant is air. It is, however, envisaged that other fluids could be used. For example, the coolant could comprise water or benzene. A suitable apparatus for effecting the flow of coolant would be used. Preferably the fan is arranged to suck air through the equipment. It is thought that sucking gives better flow properties than would be obtained if the fan were arranged to blow the coolant through the system.

The apparatus or guide may further include the device. The guide may be attached to the device. For example, where the device comprises a module, for example a card or PCB having several components, the PCB may be arranged in a slot or channel in the guide. The guide may include a formation for attaching the guide to the device, for example a clip, or it may be attached in a different way, for example using adhesive material.

According to the invention, there is further provided a method of cooling a device, using a guide as described herein.

Also provided by the invention is the use of a guide or apparatus as described herein in the cooling of a device.

The invention also provides a method of cooling a device substantially as described herein with reference to FIGS. 1 to 5, FIG. 7 or FIG. 8 of the accompanying drawings, and a guide or an apparatus substantially as described herein with reference to and as illustrated in FIGS. 1 to 5, FIG. 7 or FIG. 8 of the accompanying drawings.

Any feature in one aspect of the invention may be applied to other aspects of the invention, in any appropriate combination. Apparatus features may be applied to the method features and vice versa.

The term "sectional area" preferably refers to a transverse cross section of the channel being substantially perpendicular to the direction of the flow of coolant at that location. Furthermore, unless clear to the contrary from the context "length" preferably refers to a distance substantially parallel to the direction of flow of the coolant, and width or height preferably refers to a dimension being substantially perpendicular to the "length", where appropriate.

Where reference is made herein to "upper" and "lower" and similar expressions, preferably it refers to an arrangement in which a component is attached to the top surface of a circuit board and its upper surface is substantially horizontal. It will be appreciated that circuit boards can, in practice, be mounted "sideways" or "upside-down" and that in such arrangements, for example, the "upper" surface of the device might, in fact, be its lowest surface.

Preferred features of the present invention will now be described, purely by way of example, with reference to the accompanying drawings, in which.

Figure 1:
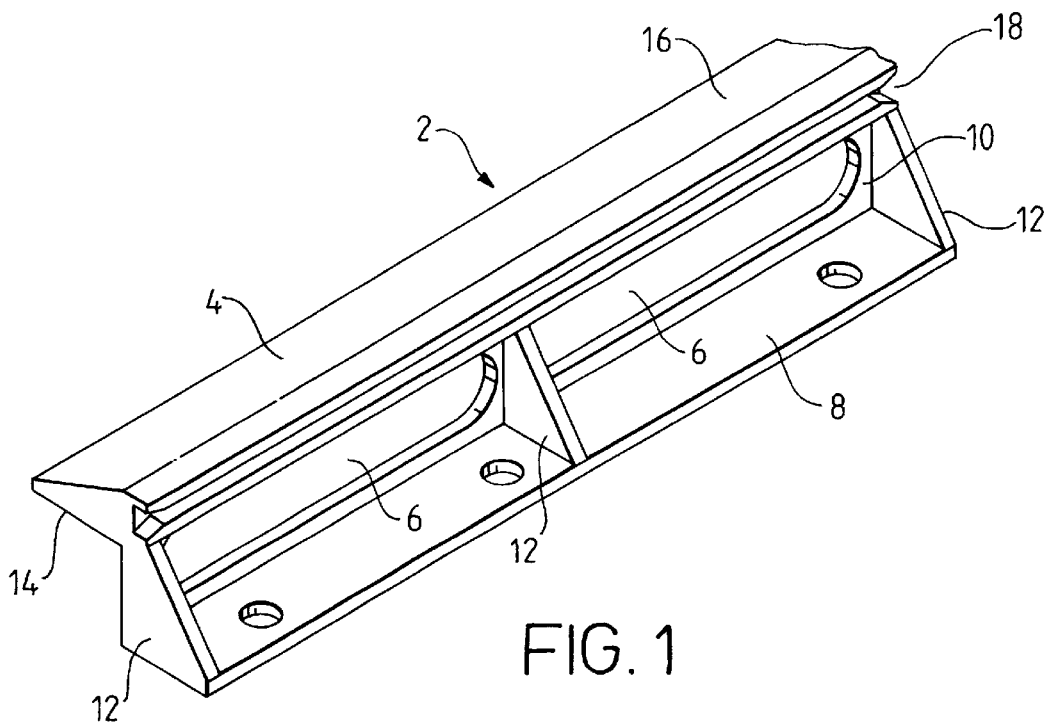
FIG. 1 is a perspective view of a flow guide.

FIG. 1 shows a flow guide 2 including a deflector 4 and two air flow slots 6.

The flow guide 2 includes a base 8 for attaching the guide 2 to the housing of equipment. Extending perpendicularly from the base 8 is a wall 10 including two slots 6 of generally elliptical shape. Struts 12 are provided extending between the wall 10 and the base 8 for strength.

Figure 4:
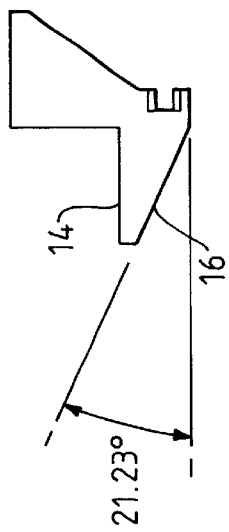
FIG. 4 shows a side view of the guide of FIG. 1.

The deflector 4 is wedge-shaped and extends from the wall 10. The rear surface 14 is parallel to the base 8 and the front surface 16 is angled at 21.23° to the base (see FIG. 4).

The deflector 4 includes, a channel 18 for insertion of a module or card, in this case a printed circuit board (PCB).

Figure 2:
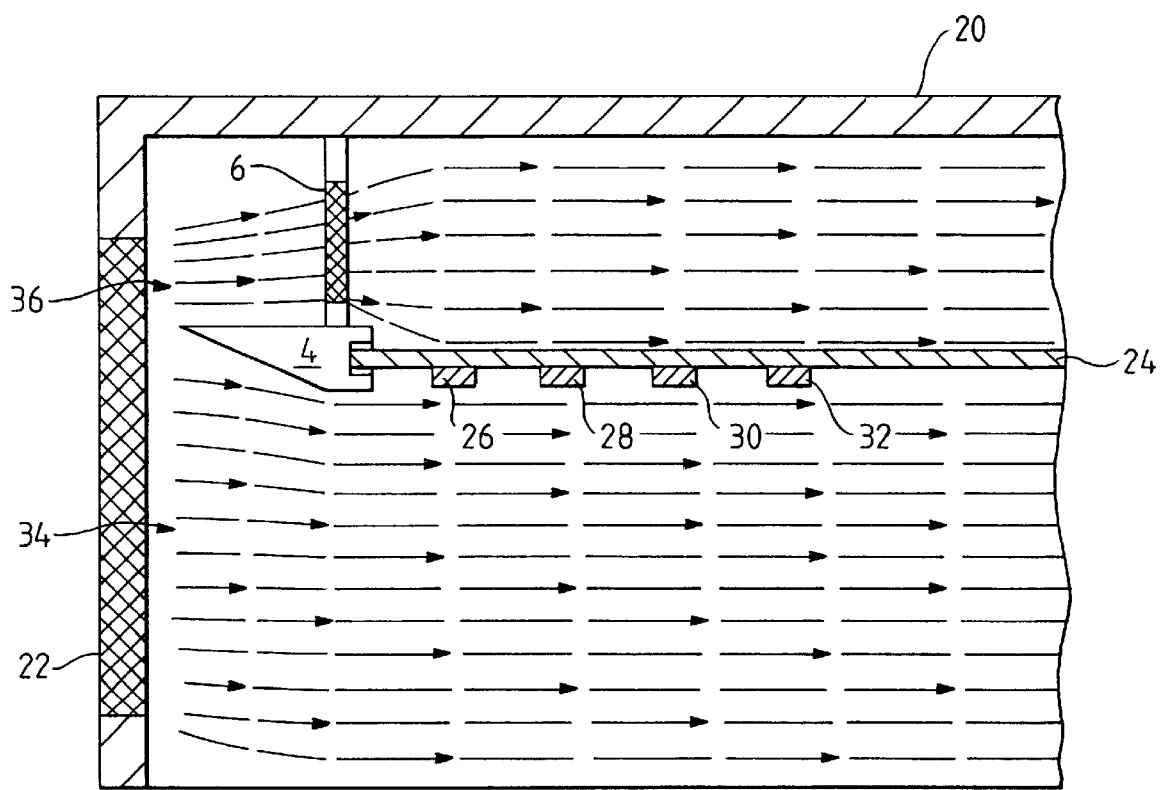
FIG. 2 shows a sectional side view of equipment including the flow guide.

FIG. 2 shows schematically the flow guide 2 mounted in equipment. The guide 2 is mounted in the housing 20. The housing has a grille 22 through which air flows when a fan 38 is activated.

A PCB 24 is mounted in the channel 18 of the guide 2. The PCB 24 as shown has four devices 26, 28, 30 and 32 mounted on its front surface.

Air entering through the grille 22 is separated into two flow streams 34, 36. The front stream 34 flows over the front surface of the deflector 4, and over the devices 26, 28, 30 and 32. It will be seen that the front surface 16 of the deflector guides the air flow to the devices. Thus the deflector minimises losses caused by changes in the air flow direction by minimising the directional change of the air flow entering through the grille 22. This enables the air to continue at a level close to its original speed, maximising its cooling properties.

The rear flow stream 36 flows through the air flow slots 6 and flows over the rear surface of the card, which cools the PCB and the devices mounted on it by increasing convection from the rear surface. This gives a significant increase in cooling and is particularly advantageous for devices (for example BGA packages) which dissipate a large percentage of their power as heat into the PCB.

Figure 3:
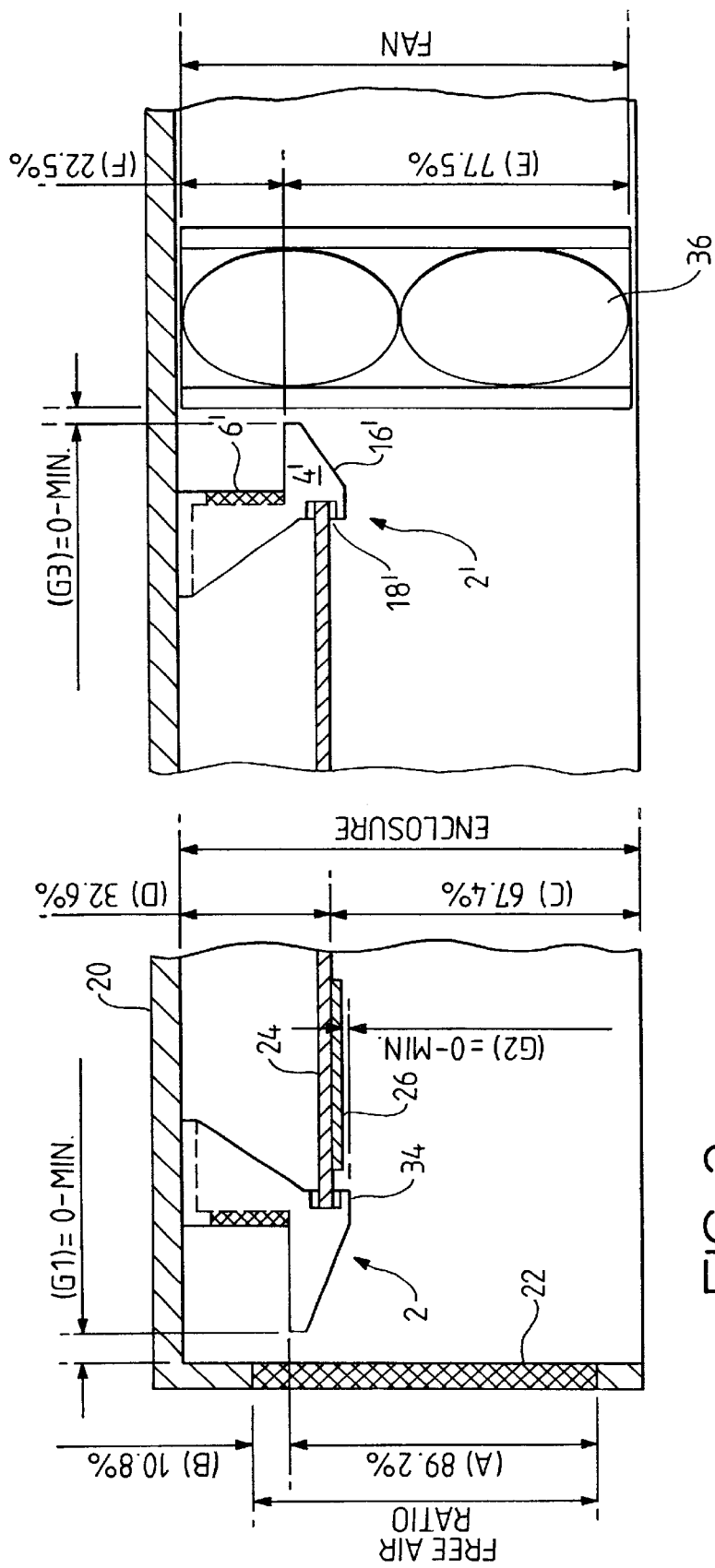
FIG. 3 shows a further sectional side view of equipment of FIG. 2 showing two flow guides.

A further guide 2' is mounted at the downstream end of the card as illustrated in FIG. 3. This supports the card in a channel 18'. The rear flow stream 36 flows out from under the card through slots 6' in the guide 2'; the front flow stream 34 flows across the front surface 16' of the guide 2'. The deflector 4' thus minimises speed losses of the air flow due to flow separation and pressure changes that might occur at the trailing edge of the card in the absence of the front surface 16' guiding the flow as the airflow leaves the edge of the module.

It will be seen from FIGS. 2 and 3 that the upstream end of the deflector 4 acts to cut the air stream into two sections. The distance ($G_1$) from the grille 22 to the deflector 4 is preferably as small as possible so that a clean split of the air flow is obtained. In arrangements where the grille 22 includes a mesh of bars, preferably the upstream end of the deflector is arranged to coincide with one of the bars of the mesh.

The height ($G_2$) of the head of the guide above the upper surface of the first downstream device 26 is preferably minimised, and is preferably zero. The distance ($G_3$) from the end of the downstream deflector 4' to the fan 36 is preferably minimised, and is preferably zero.

While it is thought that better cooling results are obtained if $G_1$ and $G_3$ are minimised, the guides of the present invention still have benefit if placed away from the inlet grille and fan.

The free air ratio is a measure of the area of the grille 22 which is open for air flow.

In this case the free air ratio is 57.8% open.

The proportion of the air entering the of the front air stream 34 and the rear air stream 36 is given by the percentage area of the grille 22 to the front (A) and to the rear (B) of the deflector 4. In the preferred arrangement of FIGS. 2 and 3, B is 10.8% and A is 89.2%.

In other applications, a different ratio may be preferred. For example, if there is benefit in having greater cooling of the rear of the card, the deflector might be arranged closer to the centre of the grille 22, for example by increasing the height of the wall 10. It is expected that in most cases the ratio A:B will be between 10:90 and 90:10.

The height of the air channel to the front of the card (C) is, in this example 41.8 mm and to the rear (D) is 20.25 mm, giving a total height of the enclosure of 62.05 mm and a ratio of C:D of 67.4:32.6. Again, in other applications a different ratio may be preferred. It is expected that in most cases the ratio C:D will be between 10:90 and 90:10.

The height of the deflector 4' from the housing at the fan (F) is 13.55 mm, and to the front of the deflector 4' (E) is 46.45 mm, giving a ratio of E:F or 77.5:22.5. Again, in other applications a different ratio may be preferred. It is expected in most cases that the ratio E:F will be between 10:90 and 90:10.

Figure 5:
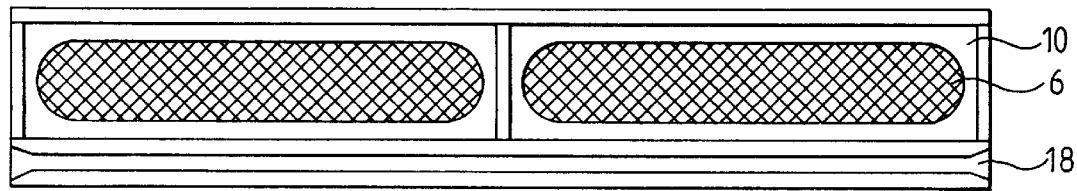
FIG. 5 shows an end view of the guide of FIG. 1.

FIG. 5 shows an end view (to scale) of the guide 2 showing the size and shape of the slots in the wall 10. Generally, the slots 6 are made as large as possible to maximise the volume of air flowing at the rear of the card, without compromising the strength of the guide.

The guide is made in one piece by injection moulding. The guide is made of plastics material, in this case polycarbonate.

EXAMPLES

The effect of the guide 2 was assessed by comparing the cooling obtained using the guide 2 of FIG. 1, compared with a conventional arrangement in which the card guide 40 had no slots 6 (thus no flow over the rear surface was possible) and no deflector. The arrangement of the comparative example is shown in FIG. 6.

Figure 6:
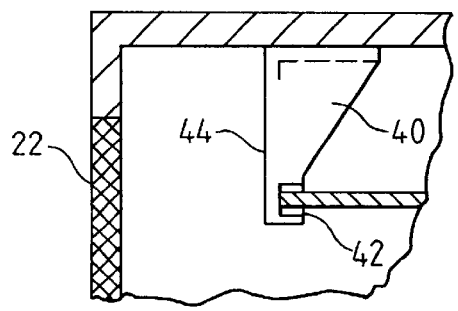
FIG. 6 shows a sectional side view of a comparative example.

FIG. 6 shows a guide 40 having a channel 42 for insertion of a card. The guide 40 has no slots to allow air flow on the rear surface of the card, and no deflector. It will be seen that air entering through the grille 22 will encounter a flat wall section 44 (the side of the guide), which will cause a large increase in the static pressure and flow separation. The following example shows that the air speeds close to the surface of the card are reduced, which causes increased junction temperature of the devices.

The tests were carried out using a software simulation, in this case using the FLOTHERM thermal analysis software of Flomerics Ltd. The simulation was set to test an arrangement such as that in FIG. 2 in which the four devices 26, 28, 30 and 32 are four 5400 Phy devices: Phy 1, Phy2, Phy3 and Phy4.

Two fans, each having a speed of 33 cfm were used for each test.

The results are given in Table 1 corresponding to Tests 1 and 2 as follows:

Test 1—Comparative Test

This test uses the square-sided guide 40 of FIG. 6 with no deflector or apertures.

Test 2

The guides 2 are used as shown in FIGS. 1 to 5.

TABLE 1

|  | Test 1 | Test 2 |
| --- | --- | --- |
| Air velocity at Phy 1 (m/s) | 0.38 | 1.91 |
| Junction temperature Phy 1 (° C.) | 114.1 | 103.9 |

TABLE 1-continued

|  | Test 1 | Test 2 |
|---|---|---|
| Junction temperature Phy 2 (° C.) | 115.0 | 108.8 |
| Junction temperature Phy 3 (° C.) | 117.5 | 109.6 |
| Junction temperature Phy 4 (° C.) | 116.3 | 109.2 |

Thus a considerable increase in air velocity at the device is seen, together with a significant improvement in cooling of the device. The amount of additional cooling using the guides of the invention is equivalent to the use of an additional fan or heatsink.

Thus by using the guides, the cost of the equipment can be reduced, and reliability and quality can be increased. Also, it is possible to use higher power modules which might have been excluded from consideration due to their high heat output.

Figure 7:
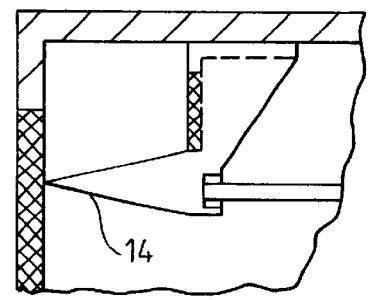
FIG. 7 shows an alternative guide.
Figure 8:
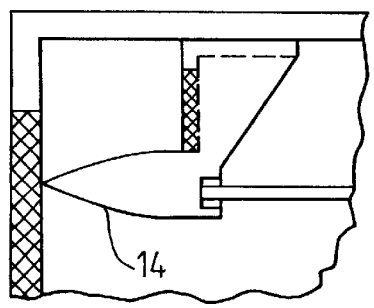
FIG. 8 shows a further alternative guide.

FIGS. 7 and 8 show alternative designs of the deflector 4. In both FIGS. 7 and 8 the rear surface 14 of the deflector is also angled to the base to give better flow to the rear of the card. The deflector in FIG. 7 is V-shaped, and that in FIG. 8 is more U-shaped, to give different flow patterns of the air streams. Such different shapes may be preferred, for example, depending on the type and size of devices to be cooled, and the other dimensions of the system.

It will be understood that the present invention has been described above purely by way of example, and modifications of detail can be made within the scope of the invention.

Each feature disclosed in the description, and (where appropriate) the claims and drawings may be provided independently or in any appropriate combination.

Any reference numerals appearing in the claims are by way of illustration only and shall have no limiting effect on the scope of the claims.

What is claimed is:

1. A guide member for the support of a circuit board in a flow of gaseous coolant within an enclosure, comprising:
   a base;
   a wall extending from said base;
   a channel, formed in a rear side of said wall and spaced from said base, for the reception of an edge of said circuit board, said wall comprising, between said channel and said base, slots for the passage of said flow of coolant over a first surface of said circuit board; and
   a wedge shaped deflector extending from a front side of said wall upstream into said flow and for diverting a selected proportion of said flow over a second surface of said circuit board.

2. The guide member of claim 1 wherein said surfaces of said wedge shaped deflector are inclined at an angle between 10° and 30°.

3. The guide member of claim 2 wherein said angle is between 20° and 25.

4. The guide member of claim 1 wherein said wedge shaped deflector has a first surface which is substantially parallel to said first surface of said printed circuit board and a second surface which is inclined with respect to said first surface.

5. The guide member of claim 1 wherein said wedge shaped deflector extends from said wall in a direction away from said circuit board.

6. The guide member of claim 1 wherein said base, said wall, said channel and said wedge shaped deflector are formed as one piece.

7. An apparatus comprising:
   an enclosure;
   a circuit board in the enclosure;
   a fan for generating a flow of gaseous coolant past the circuit board, and;
   a first guide for supporting said circuit board in a plane generally parallel to said flow of gaseous coolant, said first guide comprising:
      a first base,
      a first wall extending from said first base and having first slots for the passage of said flow of coolant over a first surface of said circuit board,
      a first channel for the reception of said circuit board, and
      a first wedge shaped deflector extending from said first wall upstream into said flow and for diverting a selected proportion of said flow over a second surface of said circuit board.

8. The apparatus of claim 7 wherein said first wedge shaped deflector has a first surface which is substantially parallel to said first surface of said circuit board and a second surface which is inclined at an angle between 10° and 30° to said first surface of the first wedge shaped deflector.

9. The apparatus of claim 8 wherein said angle is between 20° and 25°.

10. The apparatus of claim 7 wherein said first wedge shaped deflector has a first surface which is substantially parallel to said first surface of said circuit board and a second surface which is inclined with respect to said first surface.

11. The apparatus of claim 7 wherein said first wedge shaped deflector extends from said first wall in a direction away from said circuit board.

12. The apparatus of claim 7 further comprising:
   a second guide comprising:
      a second base;
      a second wall extending from said second base and having second slots for the passage of said flow of coolant away from said first surface of said circuit board, a second channel for the reception of said circuit board, and a second wedge shaped deflector extending downstream of said flow to provide a smooth transition for said flow from regions adjacent said first and second surfaces of said circuit board and a region downstream of said second wedge shaped deflector of said second guide.

13. The apparatus of claim 7 wherein said first base, said first wall, said first channel and said first wedge shaped deflector are formed as one piece.

* * * * *